United States Patent
Park et al.

(10) Patent No.: US 7,211,467 B2
(45) Date of Patent: May 1, 2007

(54) METHOD FOR FABRICATING LEADLESS PACKAGES WITH MOLD LOCKING CHARACTERISTICS

(75) Inventors: Sang-Bae Park, Kaohsiung (TW);
Yong-Gill Lee, Kaohsiung (TW);
Hyung-Jun Park, Kaohsiung (TW);
Kyung-Soo Rho, Kaohsiung (TW);
Jin-Hee Won, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 359 days.

(21) Appl. No.: 10/973,385

(22) Filed: Oct. 27, 2004

(65) Prior Publication Data

US 2005/0260795 A1 Nov. 24, 2005

Related U.S. Application Data

(63) Continuation-in-part of application No. 10/851,112, filed on May 24, 2004, now Pat. No. 6,984,878.

(51) Int. Cl.
*H01L 21/00* (2006.01)

(52) U.S. Cl. .................... 438/111; 438/112; 438/123; 438/FOR. 367; 438/FOR. 377; 438/FOR. 380

(58) Field of Classification Search .............. None
See application file for complete search history.

(56) References Cited

U.S. PATENT DOCUMENTS

| 6,143,981 | A | 11/2000 | Glenn | 174/52.4 |
| 7,042,068 | B2 * | 5/2006 | Ahn et al. | 257/666 |
| 7,125,747 | B2 * | 10/2006 | Lee et al. | 438/112 |

FOREIGN PATENT DOCUMENTS

| JP | 63-302545 | * | 12/1988 | 257/666 |
| JP | 2-97048 | * | 4/1990 | 257/670 |

* cited by examiner

*Primary Examiner*—Jasmine Clark
(74) *Attorney, Agent, or Firm*—Troxell Law Office, PLLC

(57) ABSTRACT

A method for fabricating leadless packages with mold locking characteristics is disclosed. A provided leadless leadframe has a plurality of units in a matrix, each unit includes an improved die pad with a plurality of indentations, such as semi-vias in the sidewall thereof and a plurality of leads around the die pad. After chip attachment and electrical connection, a plurality of package bodies for semiconductor packages are individually formed on the corresponding units and covered the indentations in order to enhance the horizontal mold locking capability of the die pad. Using punching, connecting bars of the leadless leadframe are removed to isolate the leadless packages.

16 Claims, 10 Drawing Sheets

METHOD FOR FABRICATING LEADLESS PACKAGES WITH MOLD LOCKING CHARACTERISTICS

This application is a continuation-in-part of currently U.S. application Ser. No. 10/851,112, filed on May 24, 2004, now U.S. Pat. No. 6,984,878.

FIELD OF THE INVENTION

The present invention relates to a method for fabricating leadless semiconductor packages, and more particularly, to a method for fabricating leadless semiconductor packages using a leadframe with improved die pads.

BACKGROUND OF THE INVENTION

A leadless leadframe can be implemented in semiconductor package with lower costs and smaller dimensions. A well-know leadless semiconductor package comprises a semiconductor chip, a leadless metal leadframe for carrying a chip and a package body for encapsulating the chip. A plurality of leads of the leadless leadframe have the lower surfaces exposed out of the bottom of the package body for external mounting onto an PCB. Normally, no outer leads extending from sides of the package body are needed. The leadless semiconductor package has the benefits of smaller footprints, shorter electrical paths, and lower manufacturing costs.

A leadless semiconductor package is disclosed in U.S. Pat. No. 6,143,981. As shown in FIG. 1, the semiconductor package comprises a leadless leadframe 10, a semiconductor chip 20, a plurality of bonding wires 30, and a package body 40. The leadless leadframe 10 comprises a die pad 11 and a plurality of leads 12. The semiconductor chip 20 is attached to an upper surface 11a of the die pad 11. The bonding wires 30 connect bonding pads 21 of the semiconductor chip 20 to the leads 12. The package body 40 encapsulates the semiconductor chip 20. As shown in FIG. 2, it is obvious that when the lower surface 11b of the die pad 11 and the lower surfaces of the leads 12 are exposed out of the bottom surface of the package body 40 for heat dissipation and SMT connection, poor mold locking capability of the die pad 11 and the leads 12 to the package body 40 is expected. As shown in FIG. 1, a reentrant portion 13 is formed in the sidewalls of the die pad 11 and the leads 12 and is encapsulated by the package body 40 for preventing the die pad 11 peeling off from the package body 40 in the vertical direction. However, the reentrant portion 13 is annular design in the horizontal direction, therefore, it's unable to enhance the horizontal mold locking of the die pad 11 against the package body 40. Moreover, the coefficients of thermal expansion (CTE) of the die pad 11 and the package body 40 do not match with each other. Therefore, during the thermal test of the leadless semiconductor package, a horizontal stress is generated between the package body 40 and the die pad 11. The sidewall of the die pad 11 can be delaminated from the package body 40 and slide horizontally. Especially, when the temperature of the leadless semiconductor package is reached up to 260° C. for surface mounting, the sidewalls of the die pad 11 will encounter extremely high thermal stress in the horizontal direction and cause delamination from the package body 40.

SUMMARY OF THE INVENTION

A main purpose of the present invention is to provide a leadless leadframe with an improved die pad for mold locking. The leadless leadframe has a plurality of indentations formed in the sidewalls of the die pad for being encapsulated by the package body to enhance the mold locking capability of the die pad in the horizontal direction.

A second purpose of the present invention is to provide a method for fabricating leadless semiconductor packages using the leadframe. A plurality of package bodies are individually formed on the corresponding units of the leadframe and covered the indentations on the die pads. The connecting bars of the leadless leadframe can be removed by punching to isolate the leadless packages.

In accordance with the present invention the leadless leadframe with an improved die pad for mold locking is provided. The leadframe has a plurality of units in a matrix and mainly includes a die pad and a plurality of leads in each unit, and a plurality of connecting bars between the units. Each die pad has an upper surface, a lower surface and sidewalls. A plurality of indentations are formed in the sidewalls for filling a package body. The leads are arranged around the die pad and connected to the connected to the connecting bars. The horizontal mold locking capability of the die pad can be enhanced by the indentations. Preferably, the indentations are semi-vias on the periphery of the upper surface. After chip attachment and electrical connection, a plurality of package bodies are formed on the corresponding units. The package bodies cover the active surfaces of the chips, the upper surfaces of the leads and the indentations of the die pads. Moreover, the package bodies are formed individually and connected to each other via the connecting bars. Thus, the leadframe can be punched to remove the connecting bars. A plurality of leadless semiconductor packages are easily isolated from the leadfame.

DETAIL DESCRIPTION OF THE INVENTION

Please refer to the drawings attached, the present invention will be described by means of an embodiment below.

Figure 1:
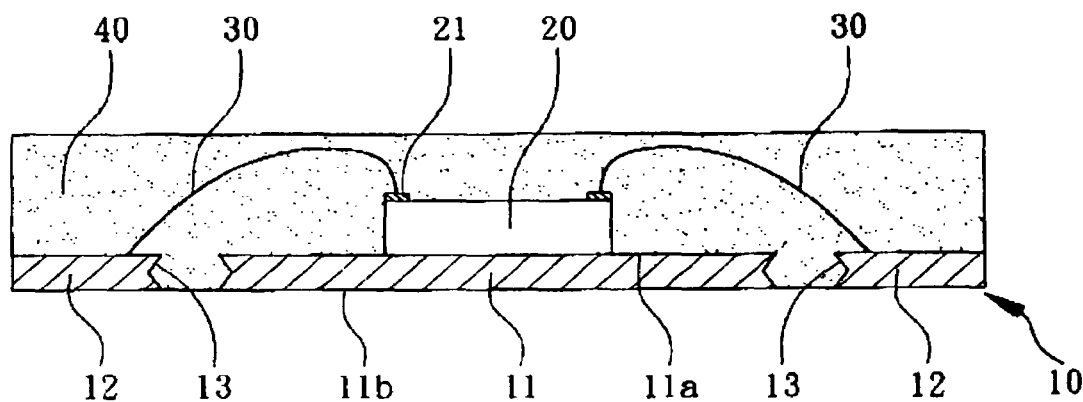
FIG. 1 is a cross-sectional view of a conventional leadless semiconductor package.
Figure 2:
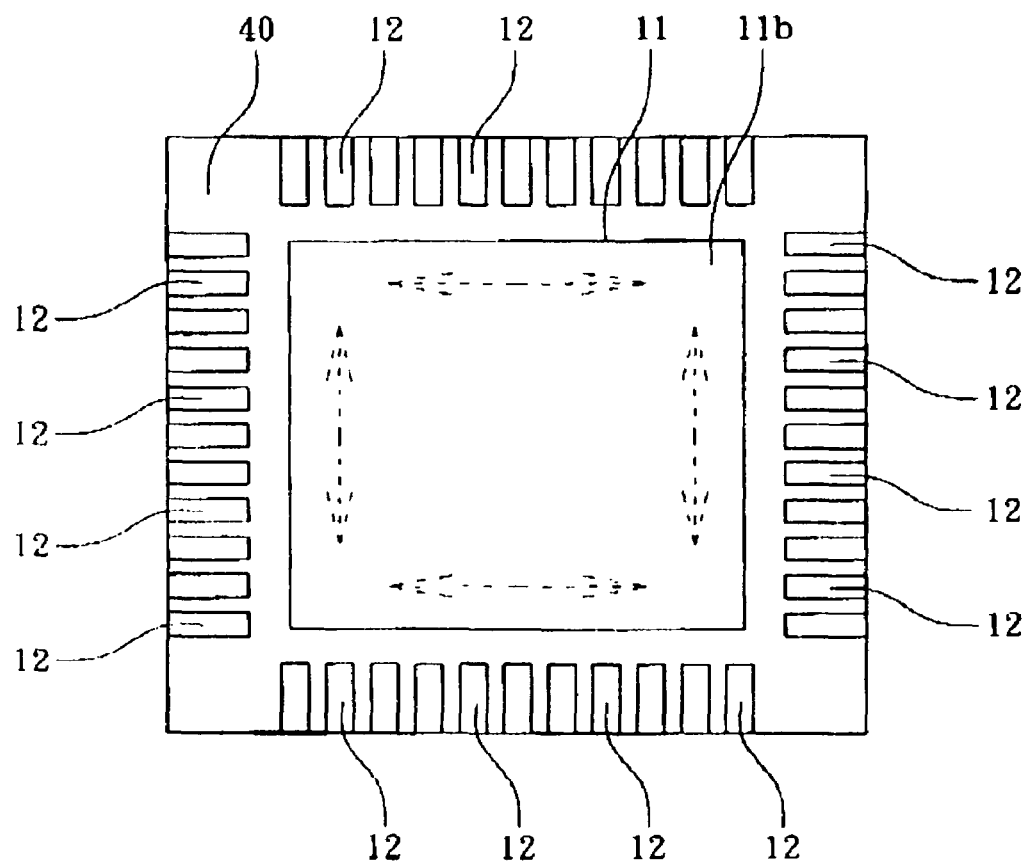
FIG. 2 is a bottom view of the conventional leadless semiconductor package.
Figure 3:
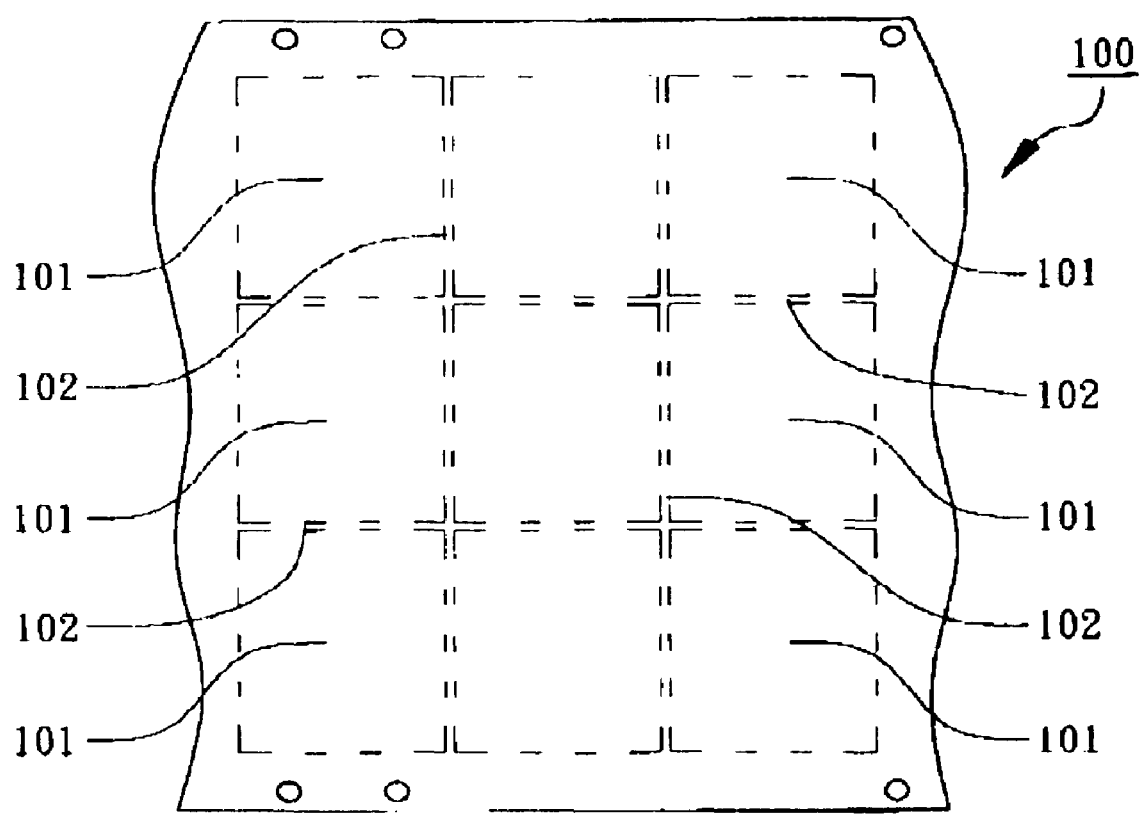
FIG. 3 is a top view of a leadless leadframe with an improved die pad for mold locking according to the first embodiment of the present invention.
Figure 4:
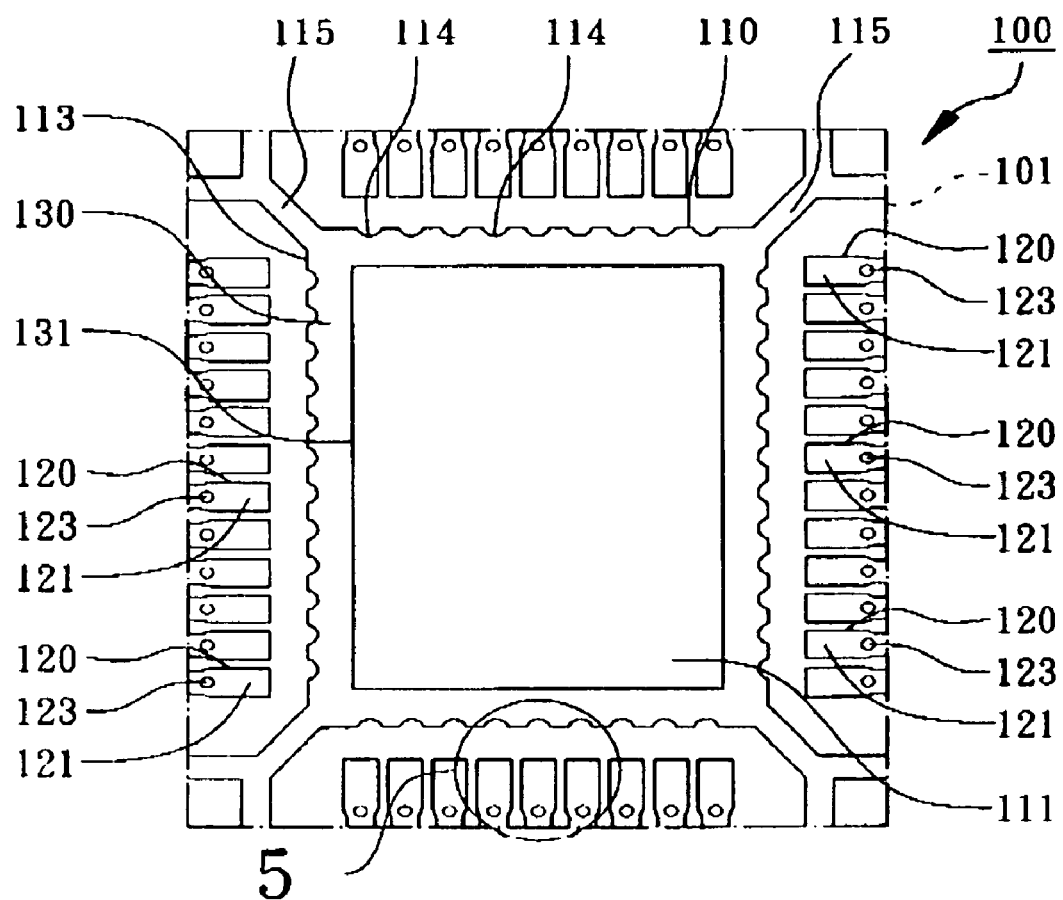
FIG. 4 is a top view of a unit of a leadless leadframe with an improved die pad for mold locking according to the first embodiment of the present invention.
Figure 5:
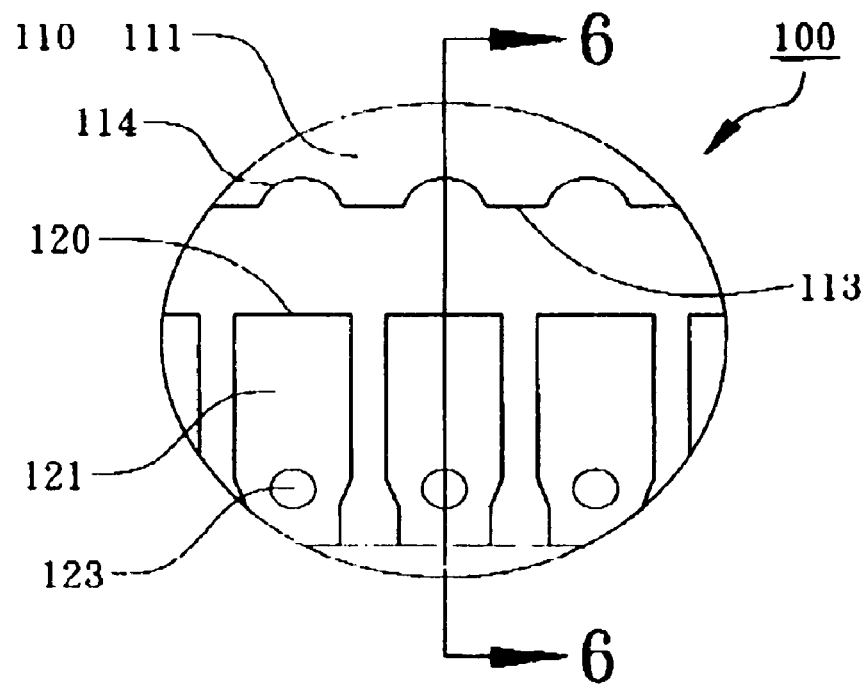
FIG. 5 is a partial top view of the leadless leadframe according to the first embodiment of the present invention.
Figure 6:
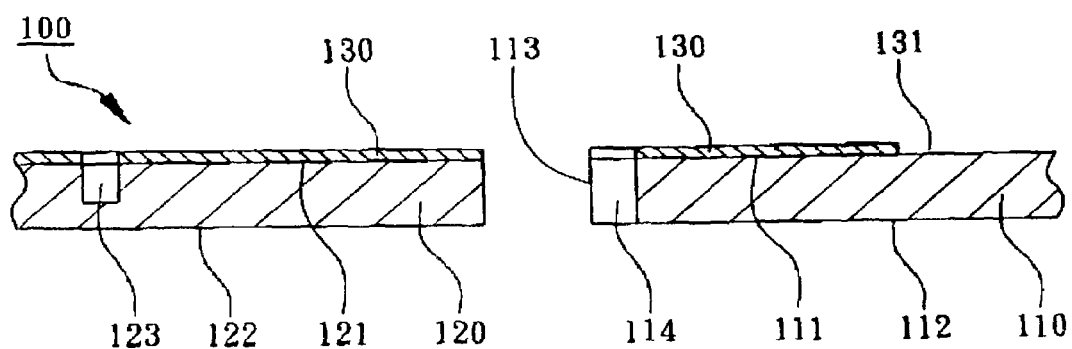
FIG. 6 is a partial cross-sectional view of the leadless leadframe along 6—6 line in FIG. 5 according to the first embodiment of the present invention.
Figure 7:
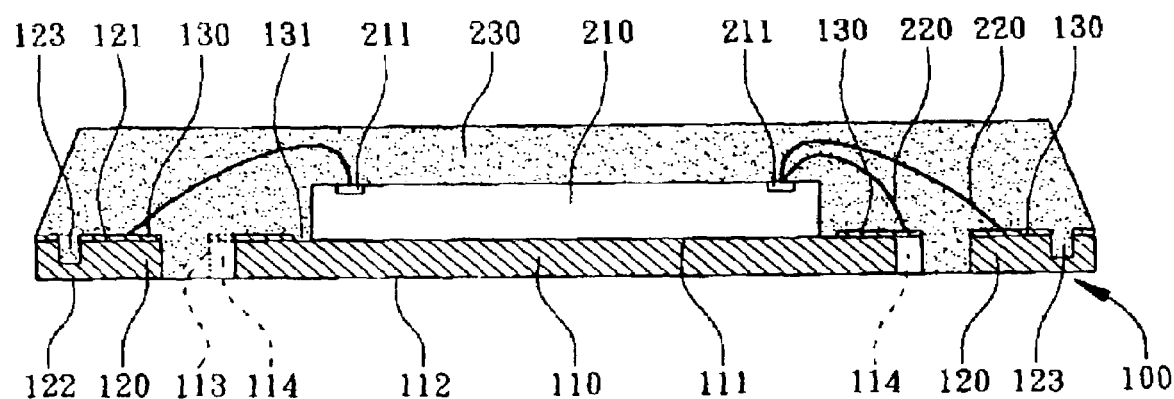
FIG. 7 is a cross-sectional view of the semiconductor package using the leadless leadframe according to the first embodiment of the present invention.

According to the first embodiment of the present invention, a leadless leadframe 100 with an improved die pad for mold locking is shown in FIGS. 3, 4, 5, and 6. As shown in FIG. 3, the leadframe 100 has a plurality of units 11 in a matrix and a plurality of connecting bars 102 between the units 101. As shown in FIG. 4, the leadframe 100 in each unit 101 comprises a die pad 110 and a plurality of leads 120, which are connected together via the connecting bars 102. As shown in FIG. 6, the die pad 110 has an upper surface 111, a lower surface 112 and at least a sidewall 113. The sidewall 113 is located between the upper surface 111 and the lower surface 112. The sidewall 113 can be vertical or oblique. The height of the sidewall 113 can be equal to or smaller than the thickness of the die pad 110. As shown in FIG. 7, the upper surface 111 of the die pad 110 is configured for attaching a semiconductor chip 210. The lower surface 112 of the die pad 110 is exposed out of the bottom of a package body 230 for enhancing the capability of heat dissipation and providing an electrical connection to the electrical ground. The die pad 110 is connected to the connecting bars 102 or frame of the leadless leadframe 100 via a plurality of tie bars 115 in corresponding units 101. As shown in FIG. 5, a plurality of indentations 114 are formed in the sidewall 113 of the die pad 110. The indentations 114 are semi-vias in the sidewalls 113 which are grooves extending vertically from the periphery of the upper surface 111 for filling the package body 230, as shown in FIG. 7. Preferably, the indentations 114 are arranged in the same pitch. In the this embodiment, the indentations 114 are semi-vias be located in the sidewalls 113 and on the periphery of the upper surface 111, which are in semi-circular shape through the upper surface 111 and the lower surface 112 of the die pad 110. Moreover, the leads 120 are arranged around the die pad 110. By means of the indentations 114, the horizontal mold locking capability of the die pad 110 can be enhanced so that the die pad 110 will not be horizontally delaminated from a package body of a semiconductor package.

Referring to FIGS. 5 and 6, each lead 120 has an tipper surface 121 and a lower surface 122. The leads 120 have at least a mold locking blind via 123 on the upper surfaces 121. The mold locking blind via 123 is adjacent to one end of the corresponding lead 120 away from the die pad 110 for enhancing the mold locking capability of the leads 120 during lead cutting. In the this embodiment, a metal layer 130 made from silver or nickel/gold is plated on the upper surface 111 of the die pad 110 and the upper surfaces 121 of the leads 120 for enhancing the wire-bonding connection of the bonding wires 220, as shown in FIG. 7. The metal layer 130 has an opening 131 which exposes the die attach area of the die pad 110 for die attaching the semiconductor chip 210, as shown in FIG. 7.

Figure 8:
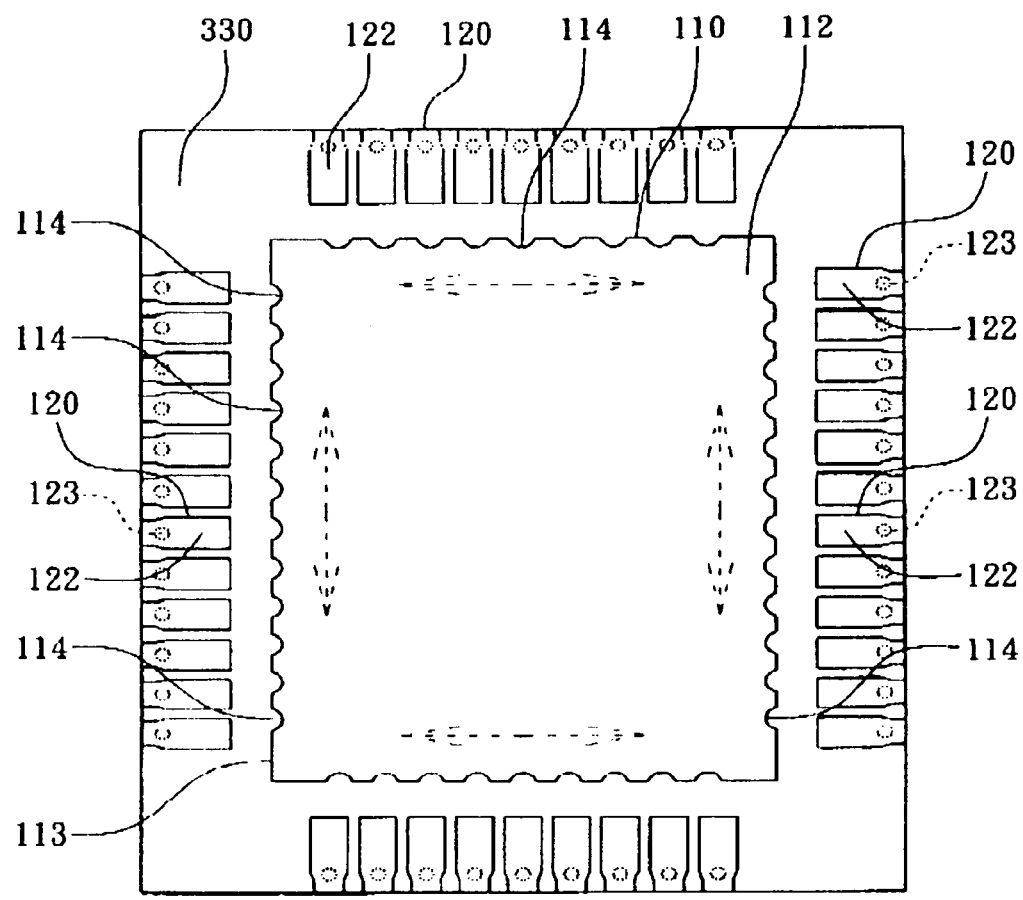
FIG. 8 is a bottom view of the semiconductor package using the leadless leadframe according to the first embodiment of the present invention.
Figure 9:
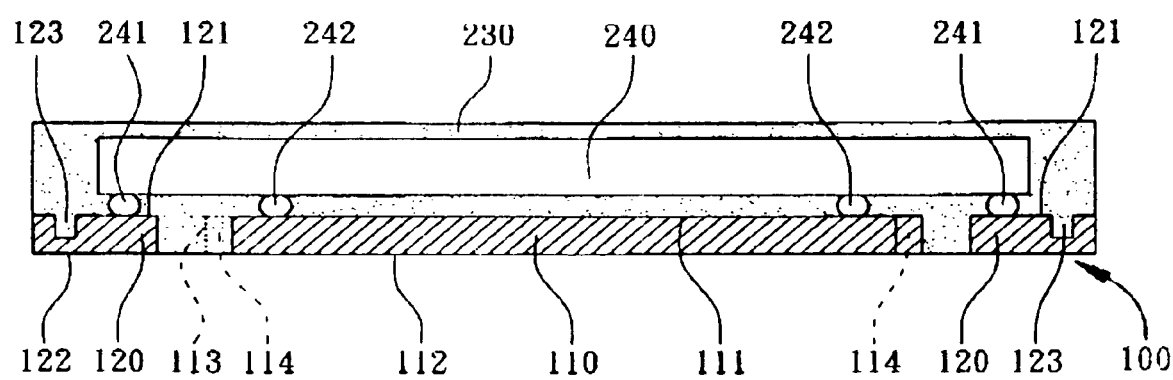
FIG. 9 is a cross-sectional view of another semiconductor package using the leadless leadframe according to the second embodiment of the present invention.
Figure 10:
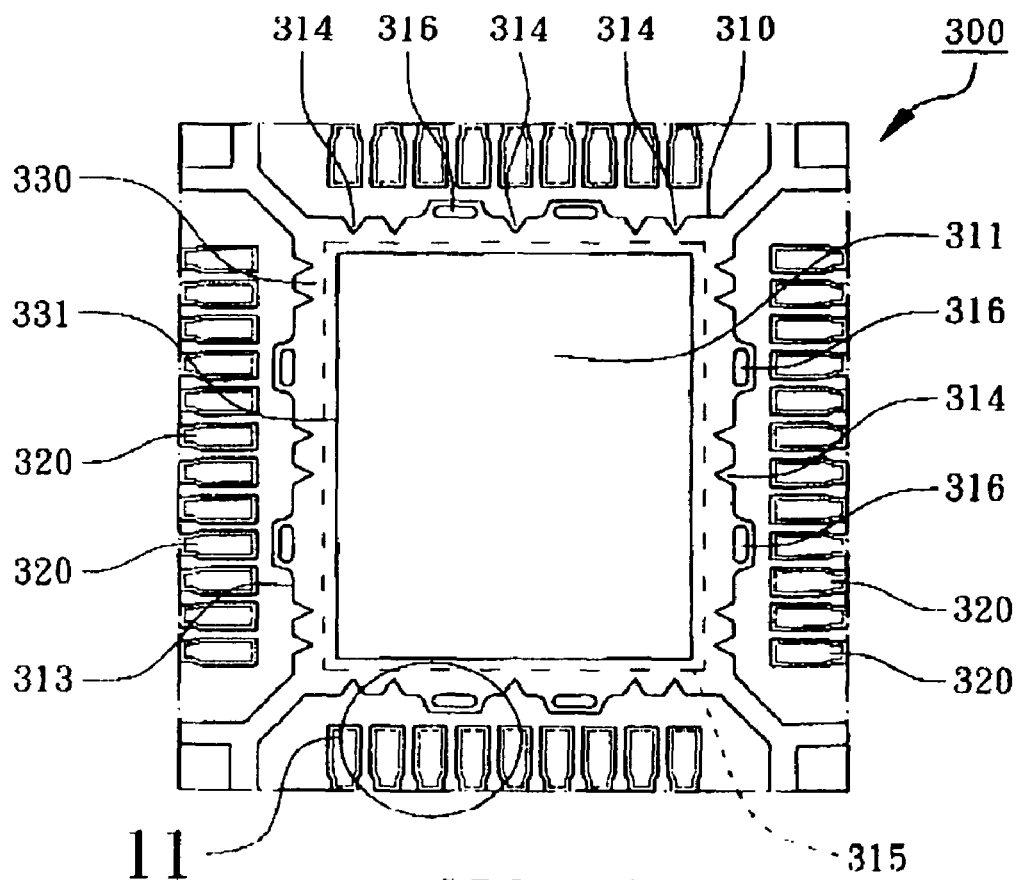
FIG. 10 is a top view of the leadless leadframe according to the third embodiment of the present invention.
Figure 11:
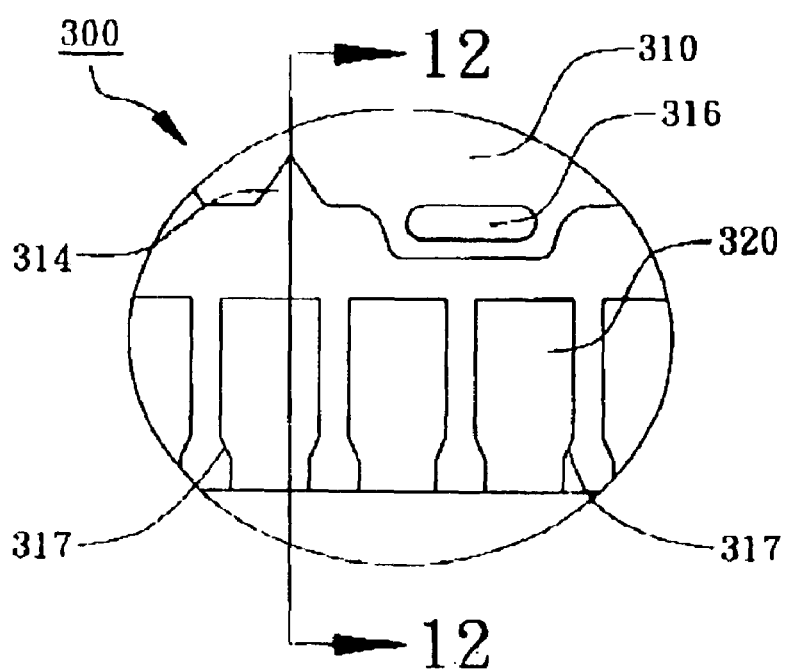
FIG. 11 is a partial top view of the leadless leadframe according to the third embodiment of the present invention.
Figure 12:
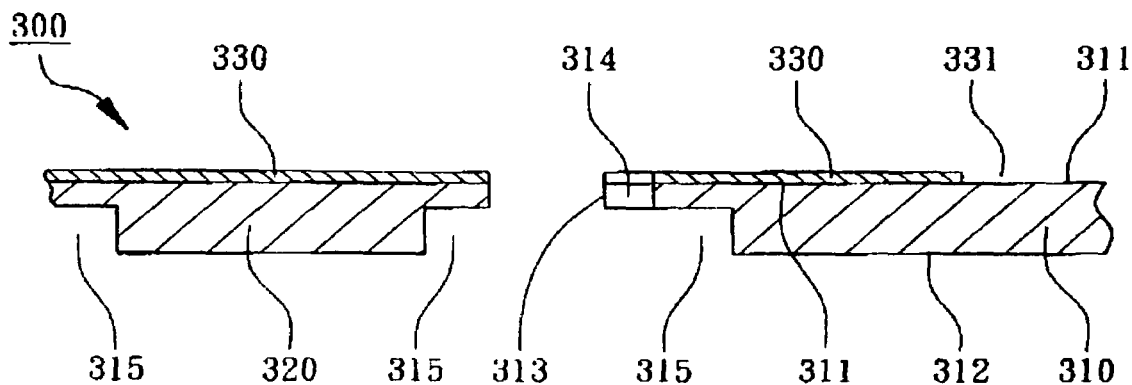
FIG. 12 is a partial cross-sectional view of the leadless leadframe along 11—11 line in FIG. 10 according to the third embodiment of the present invention.

Referring to FIG. 7, when the leadless leadframe 100 mentioned above is implemented in manufacturing a semiconductor package, a semiconductor package comprises the die pad 110 and the leads 120 from the leadless leadframe 100. A semiconductor chip 210 is attached to the upper surface 111 of the die pad 110. A plurality of bonding wires 220 connect the bonding pads 211 of the semiconductor chip 210 to the upper surfaces 121 of the leads 120. At least one of the bonding wires 220 connects the ground pad of the chip 210 to the peripheral portion of the upper surface 111 of the die pad 110 or the tie bar 115 which is plated with the metal layer 130. A package body 230 including electrically insulated resin is formed on the leadless leadframe 100. The package body 230 encapsulates the semiconductor chip 210 and the bonding wires 220, and fills the indentations 114 of the die pad 110 and the mold locking blind holes 123 of the leads 120. As shown in FIG. 8, the lower surface 112 of the die pad 110 and the lower surface 122 of the leads 120 are exposed out of the bottom of the package body 230 for heat dissipation and electrical connection to the outside world. When the semiconductor package mentioned above passes through a thermal test, the indentations 114 can disperse the horizontal thermal stress and firmly hold the sidewall 113 of the die pad 110 with the package body 230 in the horizontal direction. Therefore, the sidewall 113 of the die pad 110 will not easily delaminate from the package body 230. Moreover, the mold locking blind holes 123 are able to hold the leads 120 in the horizontal direction firmly to avoid any defeats during singulation. Although, in the first embodiment, the chip 210 is electrically connected to the leads 120 through the bonding wires 220. But the leadless leadframe 100 not only can be used for packaging a wire-bonding chip, also can be used for packaging a flip chip. Referring to FIG. 9, a flip chip 240 can be flip-chip mounted to the leadless leadframe 100 in the second embodiment. A plurality of bumps 241 are attached onto the flip chip 240 and are connected to the leads 120. Moreover, the flip chip 240 is attached to the die pad 110 using at least a dummy bump 242, and ground bumps, adhesive tapes or liquid compounds can be an alternative to fix the flip chip 240 on the die pad 110. In accordance with the third embodiment of the present invention a leadless leadframe with an improved die pad for mold locking is shown in FIGS. 10, 11 and 12. The leadless leadframe 300 in each packaging unit comprises a die pad 310 and a plurality of leads 320. The die pad 310 has an upper surface 311, a lower surface 312 and at least a sidewall 313. The leads 320 are arranged around the die pad 310. A plurality of indentations 314 are formed in the sidewall 313 of the die pad 310. The indentations 314 are vertical grooves extending from the periphery of the upper surface 311. In this embodiment, the indentations 314 are V-shaped, U-shaped or semicircle shaped grooves on the periphery of the upper surface 311 as shown in FIGS. 10 and 11. As shown in FIG. 12, a half-etching portion 315 is formed at the periphery of the lower surface 312 of the die pad 310 and the periphery of the lower surface of the leads 320, so that the area of the upper surface 311 is larger than the area of the lower surface 312. Thus the indentations 314 may not extend to the lower surface 312 of the die pad 310. Moreover, the die pad 310 has at least a mold locking through hole 316 which is formed in the upper surface 311 of the die pad 310 corresponding to the half-etching portion 315. The mold locking through hole 316 does not extend to the lower surface 312 of the die pad 310 for easily filling a package body. Therefore, the horizontal mold locking capability of the die pad 310 can be enhanced by means of the indentations 314. In a semiconductor package, a package body can fill the indentations 314 so that the die pad 310 will not easily delaminate from the package body in the horizontal direction. Moreover, each lead 320 has a necking portion 317 to connect to the frame of the leadless leadframe 300 for singulation.

Figure 13:
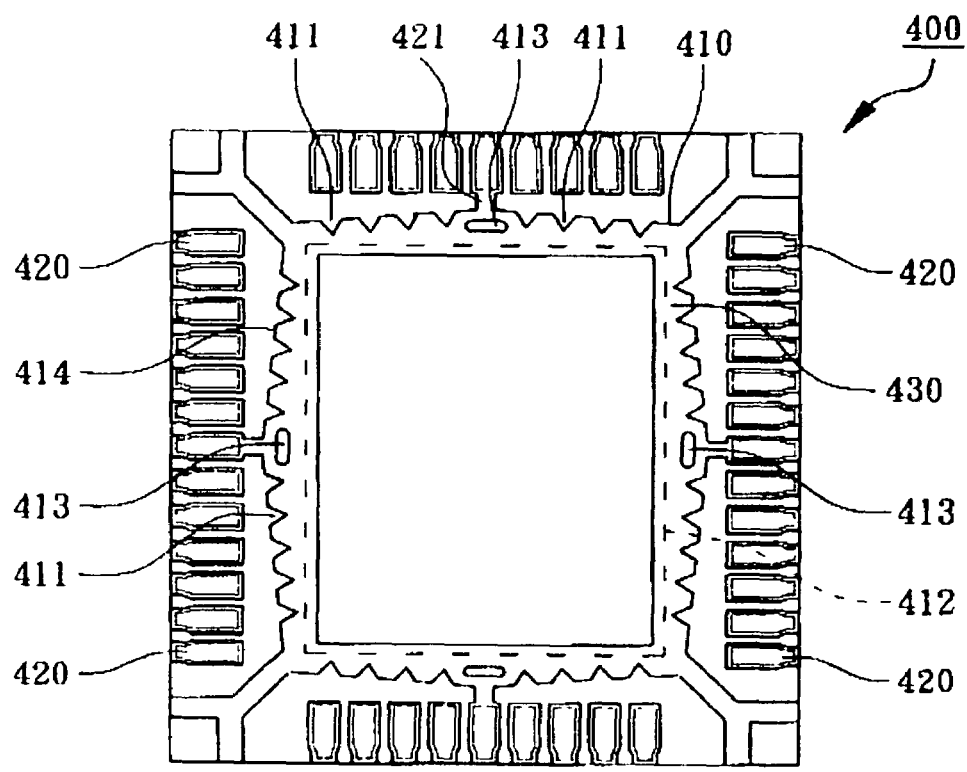
FIG. 13 is a top view of the leadless leadframe with an improved die pad for mold locking according to the fourth embodiment of the present invention.

In accordance with the fourth embodiment of the present invention another leadless leadframe 400 with an improved die pad for mold locking is shown in FIG. 13. The components disclosed in the fourth embodiment are almost the same as those in the third embodiment. The leadless leadframe 400 comprises a die pad 410 and a plurality of leads 420. The leads 420 are arranged around the die pad 410. A plurality of indentations 411 are formed in the sidewall 414 for enhancing the horizontal mold locking capability of the die pad 410 in the leadless semiconductor package. A mold locking through hole 413 is formed in the die pad 410 corresponding to the half-etching portion 412. In this embodiment, the edge between the upper surface of the die pad 410 and the sidewall 414 are oblique. Preferably, the leads 420 includes an lead 421 that is connected to the die pad 410 for changing the position of the ground terminal of the die pad 410.

Figure 14A:
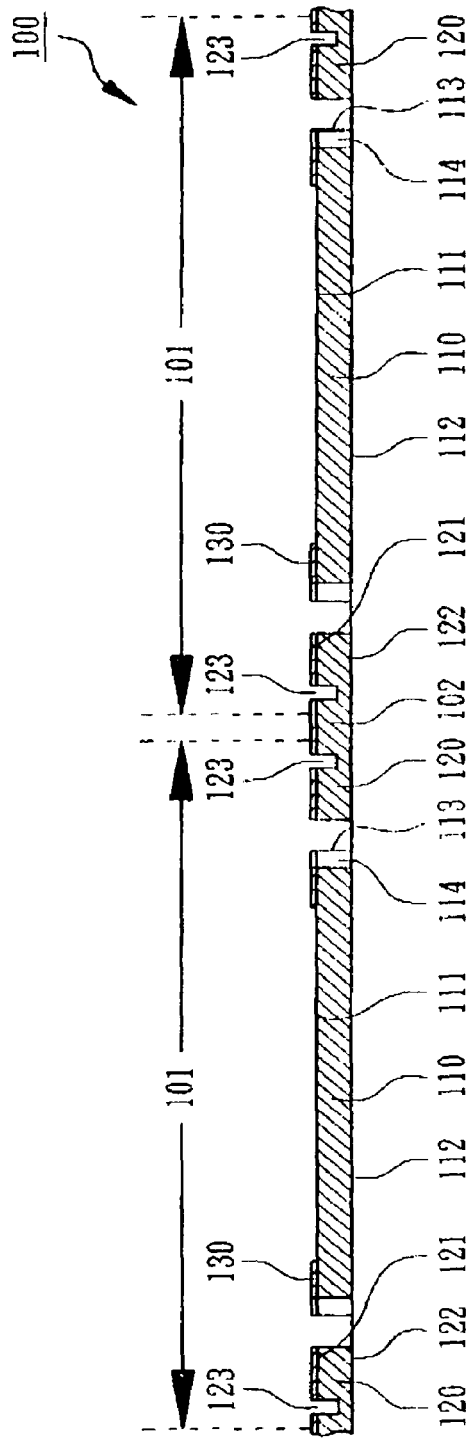
FIG. 14A~14E are cross-sectional views of leadless packages using the leadless leadframe during packaging processes according to the first embodiment of the present invention.
Figure 14B:
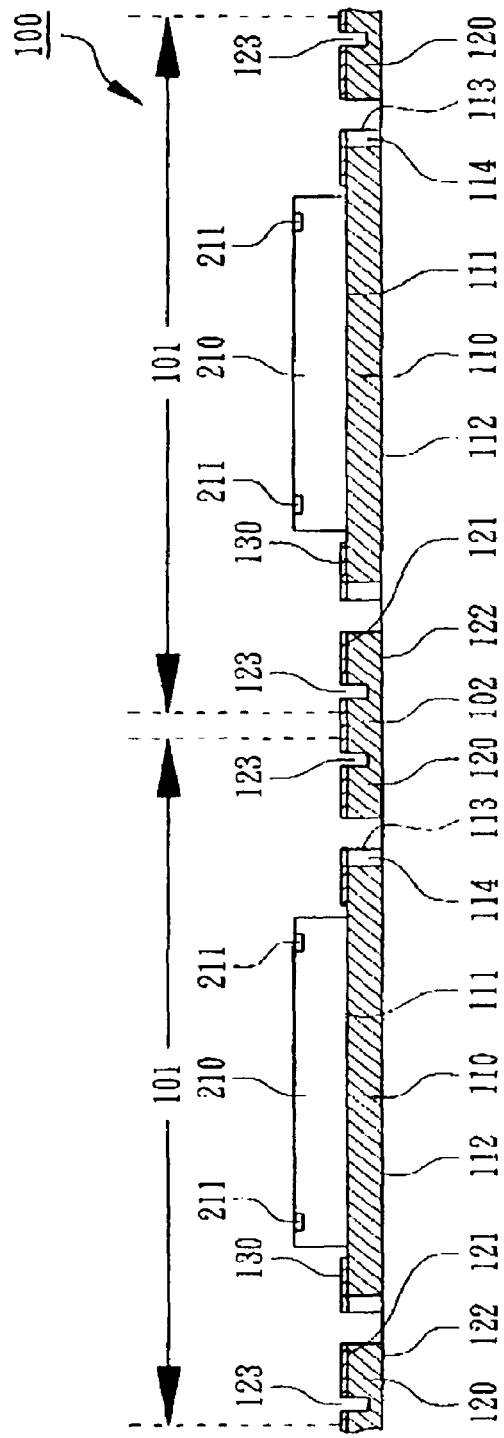
Figure 14C:
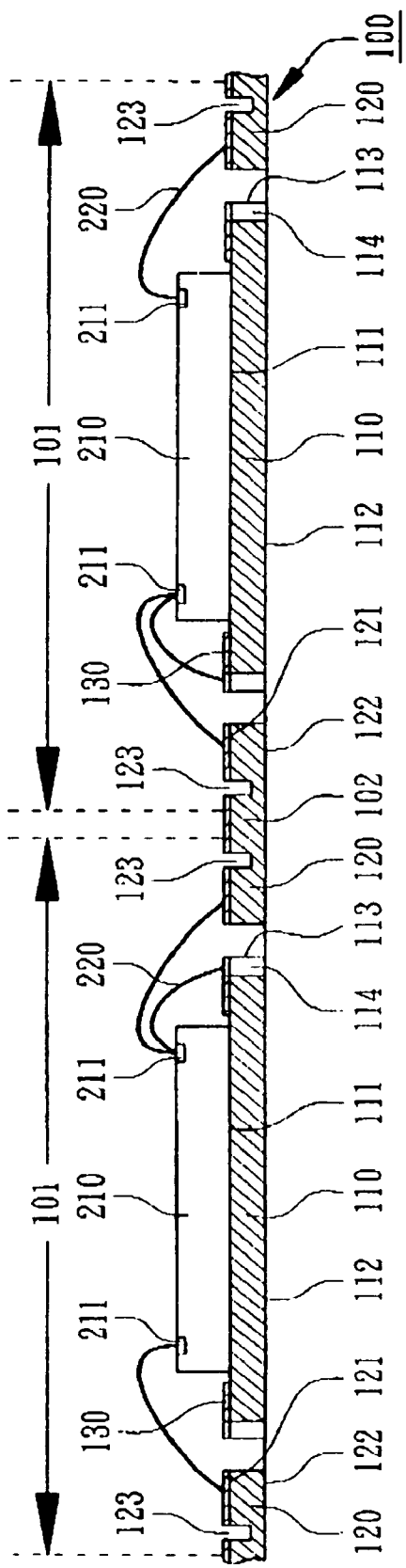
Figure 14D:
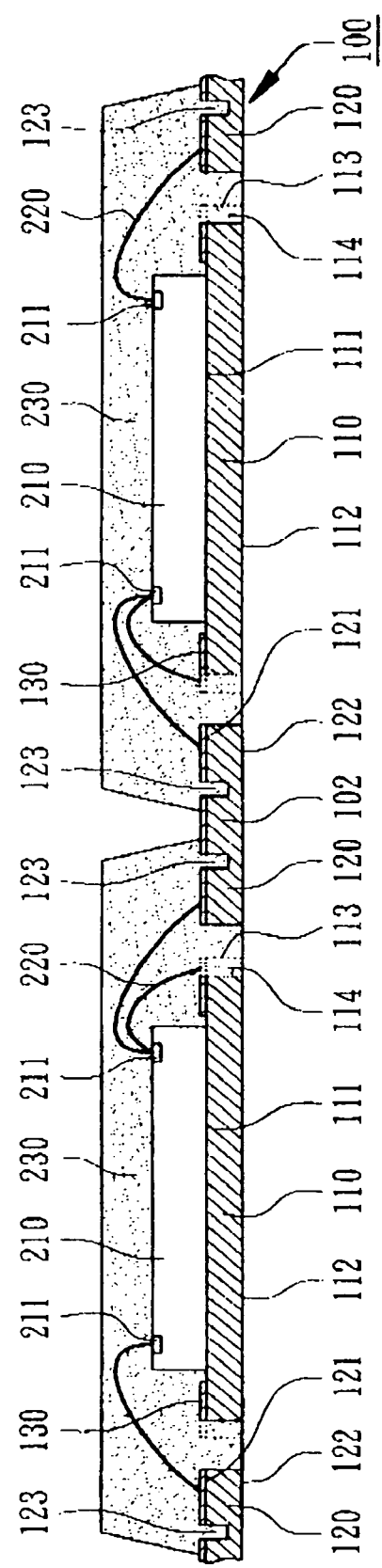
Figure 14E:
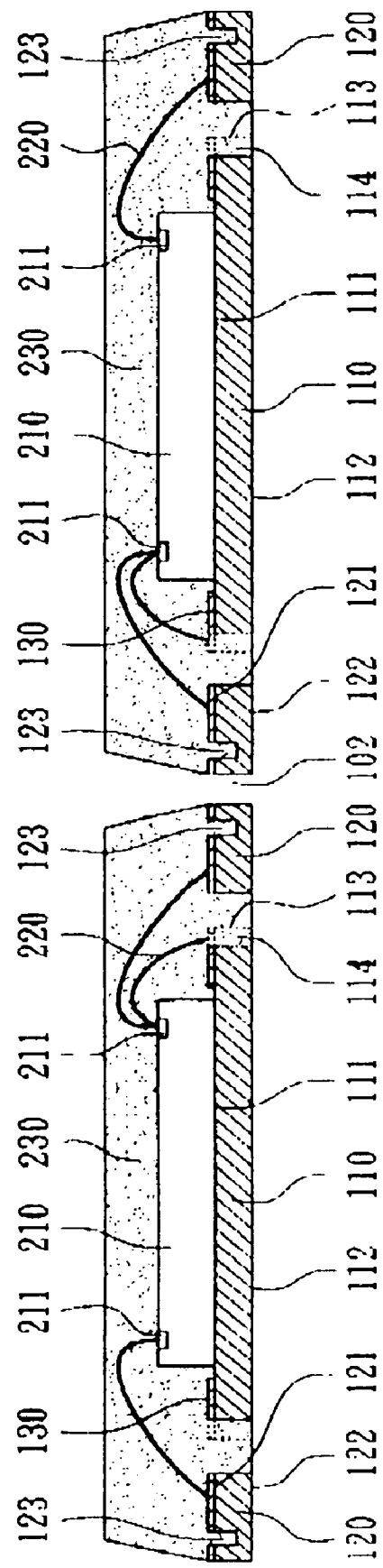

In addition, a method for fabricating leadless semiconductor packages using the leadframe 100 is also disclosed. Firstly, please refer to FIGS. 14A and 3, the leadframe 100 with the improved die pads 110 is provided. The units 101 of the leadframe 100 are arranged in a matrix. Connecting bars 102 are formed between the units 101. Each die pad 110 is formed inside the corresponding unit 101 and is surrounded by the leads 120. Then, referring to FIG. 14B, a plurality of chip 210 are attached to the upper surfaces 111 of the die pads 110 by means of adhesive compounds, tapes, eutectic layers or bumps, etc. Each chip 210 has a plurality of bonding pads 211 on the active surface thereof. Preferably, a step of electrically connection is performed. As shown in FIG. 14C, a plurality of bonding wires 220 are formed by a wire bonder to connect the bonding pads 211 of the chips 210 to the leads 120. Then, referring to FIG. 14D, a plurality of package bodies 230 are formed on the units 101. In this embodiment, the package bodies 230 are formed by molding using a mold tool with a plurality of mold cavities (not shown in figures), so that the package bodies 230 on the leadframe 100 are individually separated and connected to each other via the connecting bars 102. The package bodies 230 cover the active surfaces of the chips 210, the bonding wires 220 and the upper surfaces 121 of the leads 120 in the corresponding units 101. Also the indentations 114 of the die pads 110 and the mold locking blind vias 123 are filled with the package bodies 230. But the lower surfaces 122 of the leads 120 and the lower surfaces 112 of the die pads 110 are exposed out of the corresponding package bodies 230. However, the connecting bars 102 are free from the package bodies 230 on their upper surfaces. Then as shown in FIG. 14E, a punching step is performed. The connecting bars 102 are punched out to efficiently isolate a plurality of individual leadless packages from the leadframe. Therefore, singulation efficiency of the leadless packages in a matrix is improved to increase throughput.

The above description of embodiments of this invention is intended to be illustrative and not limiting. Other embodiments of this invention will be obvious to those skilled in the art in view of the above disclosure.

What is claimed is:

1. A method for fabricating leadless semiconductor packages comprising the steps of:
providing a leadframe having a plurality of units in a matrix, the leadframe including a die pad and a plurality of leads in each unit, and a plurality of connecting bars between the units, each die pad having an upper surface, a lower surface and a sidewall, the die pads having a plurality of indentations being formed in the sidewalls;
attaching a plurality of chips to the upper surfaces of the die pads;
electrically connecting the chips to the leads;
forming a plurality of package bodies on the corresponding units, the package bodies covering the active surfaces of the chips, the upper surfaces of the leads and the indentations of the die pads, the package bodies being formed individually and being connected to each other via the connecting bars; and
punching the leadframe to remove the connecting bars.

2. The method of claim 1, wherein the lower surfaces of the die pads and the leads are exposed out of the package bodies.

3. The method of claim 1, wherein the indentations are semi-vias on the periphery of the upper surface.

4. The method of claim 1, wherein the indentations are V-shaped, U-shaped or semicircle shaped grooves.

5. The method of claim 1, wherein the indentations pass through the upper surfaces and the lower surfaces of the die pads.

6. The method of claim 1, wherein the leadframe has a metal layer on the upper surfaces of the leads and the connecting bars.

7. The method of claim 1, wherein the leads have a plurality of mold locking blind holes in the upper surfaces thereof for filling the package body.

8. The method of claim 1, wherein each die pad has a half-etched portion at the periphery of its upper surface.

9. The method of claim 8, wherein each die pad has a mold locking through hole through the half-etched portion.

10. The method of claim 1, wherein the sidewalls of the die pads are oblique.

11. The method of claim 1, wherein each lead has a necking portion adjacent to the connecting bars.

12. The method of claim 1, wherein at least one of the leads is connected to the die pads.

13. The method of claim 1, wherein the lower surfaces of the die pads are exposed out of the corresponding package bodies.

14. The method of claim 13, wherein the lower surfaces of the leads are further exposed out of the corresponding package bodies.

15. The method of claim 1, wherein the package bodies are formed by molding.

16. The method of claim 1, wherein the connecting bars are free from the package bodies.

* * * * *